United States Patent [19]

Sohlström

[11] Patent Number: 4,561,209
[45] Date of Patent: Dec. 31, 1985

[54] DOOR IN A CONSTRUCTION PREVENTING THE TRANSITION OF INTERFERENCE FIELDS

[75] Inventor: Lasse Sohlström, Eura, Finland

[73] Assignee: Oy Euramechano AB, Finland

[21] Appl. No.: 497,727

[22] Filed: May 24, 1983

[30] Foreign Application Priority Data

May 28, 1982 [FI] Finland .................................. 821904

[51] Int. Cl.$^4$ ............................................. E05D 15/28
[52] U.S. Cl. ........................................ 49/246; 49/395; 49/257; 49/483
[58] Field of Search ................... 49/246, 254, 257–259, 49/386, 483, 394, 395, 277, 278

[56] References Cited

U.S. PATENT DOCUMENTS

| 364,753 | 6/1887 | Corry | 49/277 X |
| 2,644,989 | 7/1953 | Parkes | 49/257 X |
| 2,879,988 | 3/1959 | Klisch | 49/277 |
| 3,589,070 | 4/1970 | Hansen | 49/483 |
| 3,758,919 | 9/1973 | Dilworth, Jr. | 49/246 X |
| 4,262,447 | 4/1981 | Schneier et al. | 49/254 |

FOREIGN PATENT DOCUMENTS 1034837  7/1958  Fed. Rep. of Germany ........ 49/483

Primary Examiner—Kenneth Downey
Attorney, Agent, or Firm—Steinberg & Raskin

[57] ABSTRACT

A door assembly in a construction for preventing the transition of interference fields, in particular of high-frequency electromagnetic fields, into a space, wherein the contact zone between the door and a stationary structure is sealed by a labyrinth construction which attenuates the transition of interference fields. In prior art constructions, the provision of such labyrinth constructions increases the difficulty of door operation as a result of the high compression force which is required for closing the door as well as the tendency of the pivoting movement of the door to damage the labyrinth construction. In order to overcome this problem, apparatus are provided such that the movement of the door comprises the usual pivoting movement thereof with respect to an axis and, additionally, a substantially linear controlled final path of movement during which a contact preventing the transition of interference fields is produced.

11 Claims, 5 Drawing Figures

DOOR IN A CONSTRUCTION PREVENTING THE TRANSITION OF INTERFERENCE FIELDS

BACKGROUND OF THE INVENTION

The present invention relates generally to high-frequency electromagnetic field shielding apparatus and, more particularly, to a door assembly in a construction for substantially preventing the transition of interference fields, in particular of high-frequency electromagnetic fields, into a space.

Still more particularly, the present invention relates to a door assembly in a construction for preventing the transition of interference fields into a space which includes a door pivotally mounted to a stationary structure by at least one hinge means and wherein at least one of the door and the stationary structure is provided with means for producing an interference field transition preventing contact.

Constructions are known for providing an interference-protected or shielded space for preventing the penetration or transition of external electromagnetic energy into the protected space or, on the other hand, for confining electromagnetic energy within the space enclosed by the construction by preventing leakage of the interference field to the surrounding environment. Such prior art constructions are commonly used in order to protect sensitive equipment from electromagnetic radiation and for allowing measurements to be taken in an environment which is free from radio-frequency interference. Such constructions are generally used in industries which employ data communication and high-frequency technology in research as well as in other applications such, for example, as in hospitals.

Regardless of the particular purpose to which the protective space is put, the region of the construction providing the poorest attenuation of the interference fields is generally the zone of contact between the openable door, window, gate or the like, which is required for providing access into the protected space, and the associated stationary structure. In order to avoid deterioration of the protective properties of the door assembly, an electrical contact is provided between the movable door and the stationary door frame structure. Such electrical contact between the movable door and the stationary structure and, in the case where protection from low-frequency magnetic fields is also desired, the reluctance path between the door and the stationary structure, must be as continuous as possible and correspond to the attenuation properties of the remainder of the construction.

The attenuating properties of the contact region between the door and the stationary door frame structure can be improved, especially in the protection against transition of high frequency fields, by means of a labyrinth structure provided at the contact zone. Thus, in order to guarantee a reliable and continuous contact, knife-shaped contact tongues provided on the door are pressed between associated contact springs fitted in a groove which passes around the door opening defined by the stationary structure.

The performance of conventional door assemblies of the type described above has been limited, however, by the fact that it has not been possible to provide a multiple labyrinth structure providing the necessary tight tolerances while at the same time retaining the normal ease of operation of the door inherent in hinged door constructions. Thus, when an efficient and complicated labyrinth construction is utilized, the seal construction tends to be damaged during the pivoting movement of the normally hinged door in combination with the tight tolerances of the contact tongues penetrating between the contact springs. Thus, as the door is moved in a pivotal movement path, the contact tongues tend to pry the seal springs out of position. Moreover, the closing of the door requires an extremely high compression force which may range between 300 to 400 kp.

SUMMARY OF THE INVENTION

Accordingly, it is an object of the present invention to provide a new and improved door assembly for use in a construction for preventing the transition of interference fields into a space.

Another object of the present invention is to provide a new and improved door assembly which avoids the drawbacks of conventional door assemblies used to shield space from interference fields.

Still another object of the present invention is to provide a new and improved door assembly for preventing the transition of interference fields into a space which is simple and inexpensive and by means of which increased performance is obtained with respect to the attenuation of the interference fields.

Yet another object of the present invention is to provide a new and improved door assembly for preventing the transition of interference fields having an ease of operation corresponding to that of a conventional door so that the door can be opened rapidly and easily without the necessity of handling extra locking and compression means which would otherwise render the rapid opening of the door difficult such, for example, as in the case of an emergency.

Briefly, in accordance with the present invention, these and other objects are attained by providing in a door assembly including a door pivotally mounted to a stationary structure by at least one hinge means and wherein at least one of the doors in the stationary structure is provided with means for producing an interference field transition preventing contact between the door and stationary structure when the door is in a closed position with respect to the stationary structure, an improvement wherein the hinge means are adapted for providing a pivoting movement of the door to a position where the latter is substantially linearly displaced with respect to the stationary structure, and means for moving the door in a substantially linear movement path to the closed position to produce a contact which prevents the transition of an interference field into the protected space.

In the illustrated preferred embodiment, the substantially linear final movement of the door which produces the contact for preventing the transition of the interference field is accomplished by the provision of locking means interconnecting the door and the stationary structure, the locking means serving to guide the door in the linear movement path. The locking means is operable by means of a lever assembly associated with a door handle.

DETAILED DESCRIPTION OF THE DRAWINGS

A more complete appreciation of the present invention and many of the attendant advantages thereof will be readily understood by reference to the following detailed description when considered in connection with the accompanying drawings in which.

DETAILED DESCRIPTION OF THE PREFERRED EMBODIMENTS

It is to be understood that although the invention is described herein with respect to a door assembly, it will be understood by those skilled in the art that the invention may be applied equally as well to window or gate assemblies or the like, such assemblies being included within the scope of the term door assembly.

Figure 1:
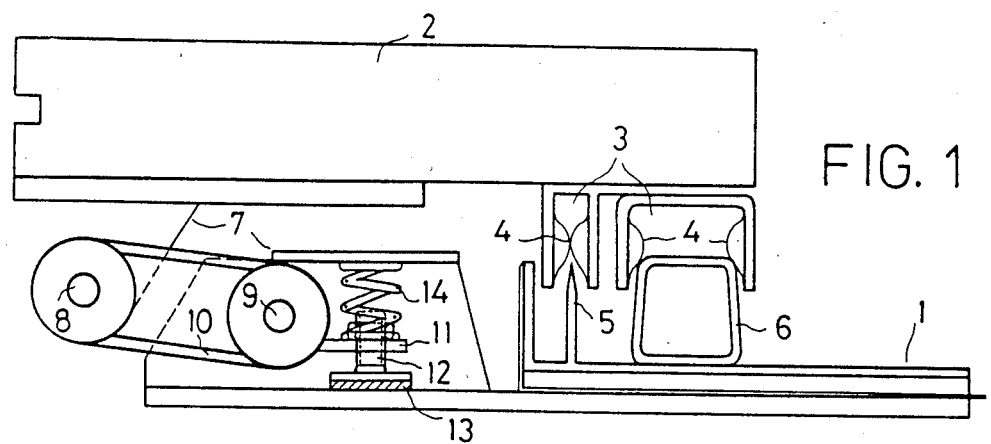
FIG. 1 is a horizontal section view of a part of a door assembly in accordance with the present invention illustrating the labyrinth structure and hinge means of a preferred embodiment.

Referring now to the drawings wherein like reference characters designate identical or corresponding parts throughout the several views, and more particularly to FIG. 1 which constitutes a horizontal sectional view of the hinge-side edge region of the door assembly, the assembly comprises a door, generally designated 1, and a stationary door frame structure 2. A labyrinth construction extends around the peripheral edge region of the door and door opening. The labyrinth construction shown in the illustrated embodiment comprises slots or channels 3 having a substantially rectangular section and constructed of an appropropriate electrically conductive material. The opposed side walls of the slots 3 are provided with springs 4 which function as seals and which are made of an appropriate electrically conductive material such, for example, as beryllium bronze. As the door 1 closes, the springs 4 receive between them the components of the labyrinth construction which are connected to the door 1, namely, a tongue-shaped contact knife 5 situated closer to the edge of the door 1 and a guide 6 having a wedge-shaped cross-section. Four of such springs 4 are used in the illustrated preferred embodiment. The function of the springs 4 is to provide a reliable electrical contact between the contact knife 5 or the guide 6 in the walls of the slots 3 and, additionally, to guide the wedge-shaped guide 6 in a precise manner as the door is being closed. Due to the close tolerances required for a reliable contact and guiding operation, according to the invention, the urging of the contact knife 5 and of the guide 6 between the contact springs 4 for the purpose of closing the door 1 beyond the position illustrated in FIG. 1 is not accomplished by the conventional pivoting movement of the door 1 but, rather, the final closing movement of the door 1 and the accompanying movement of the contact knife 5 and of the guide 6 between the spring contacts 4 is accomplished through the movement of the door 1 through a substantially linear movement path in a direction substantially perpendicular to the plane of the door. Such final linear door movement may occur over a length of about 2 cm.

According to the preferred embodiment, the final linear movement of the door 1 is accomplished by means of a two-shaft hinge device, generally designated 7, in which a pivot shaft 8 is journaled in a member which is fixed to the frame 2 and wherein another pivot shaft 9, which functions to permit the linear movement of the door, is journaled in the portion of the hinge device which is attached to the movable door. The pivot shafts 8 and 9 are interconnected to each other by an arm 10.

Moreover, the hinged device 7 is provided with means for limiting the extent of pivoting movement of the door around the shaft 9. The pivotal movement limiting means include a threaded member or screw 12 threaded in a projection 11 which is connected to the arm 10. A rubber cushion 13 is provided on the head of the screw 12 and acts as a stop to limit the rotation of the door 1 around the shaft 9. A spring 14 acts to urge the door 1 against the stop 13. Further, the distance of the stop 13 from the projection 11 and, therefore, the position of the door 1, can be adjusted by suitably rotating the screw 12.

Referring now to FIGS. 2 to 5, the mechanism by which the compression force which acts in a direction substantially perpendicular to the plane of the door and which is required to produce the linear movement of the door which results in the tight contact between the door 1 and the stationary structure 2, is produced is illustrated. The mechanism generally comprises a locking mechanism which is jointly operative between the door and stationary frame structure and which connects the door and stationary structure to each other and a system of levers for controlling the locking mechanism.

The locking mechanism in the illustrated embodiment comprises a pair of horizontally extending shafts 17 mounted on the door 1 behind the forward wall surface thereof. The shafts 17 are adapted to be vertically displaceable in mutually opposite directions in a plane substantially parallel to the plane of the face of the door by means of U-shaped rails 15 (FIG. 3) and bearings 16. Rotatable rollers 18 are journaled at the end regions of each of the shafts 17 symmetrically with respect to the longitudinal and transverse axes of the door 1.

Figure 2:
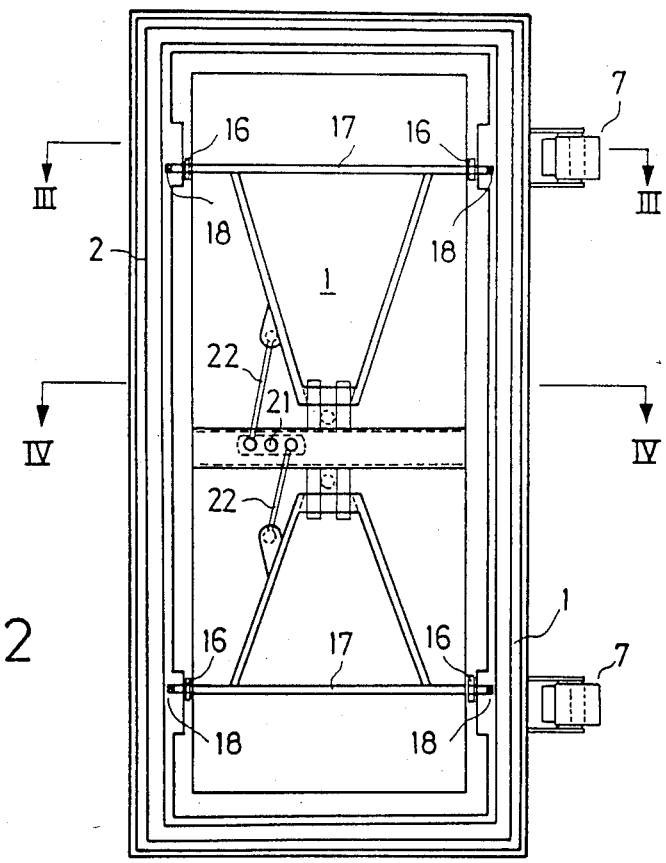
FIG. 2 is an elevation view of a door assembly in accordance with the present invention and illustrating the locking means and lever arrangement for producing the linear movement of the door.
Figure 3:
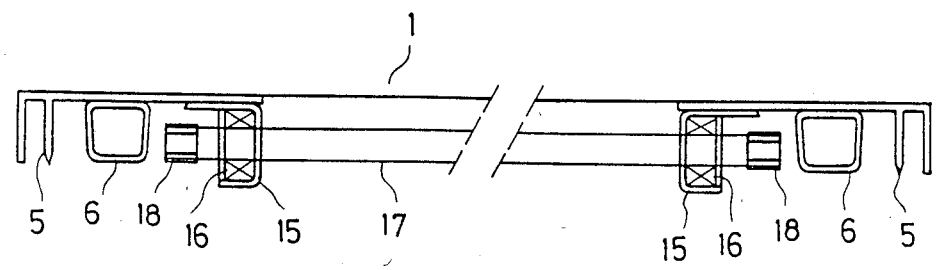
FIG. 3 is a section view taken along line III—III of FIG. 2.

The locking means further include guide means provided on the stationary structure 2 for operative association with the rollers 18. The guide means provided on the stationary structure define slots 19 which extend obliquely or diagonally in a plane which is substantially perpendicular to the plane of the face of the door 1, the rollers 18 being adapted to be received in the slots 19 during the final linear closing movement of the door. For the purpose of controlling the operation of the locking means, a system of levers which are conventional per se are provided as best seen in FIG. 2. The lever system acts to move the shafts 21 in a plane parallel to the plane of the face of the door in mutually opposite directions. Thus, a shaft 21 is rotated by means of a door handle 20 to shift rods 22 in opposite directions as the handle 20 is turned to correspondingly shift the shafts 17 in mutually opposite directions.

Figure 4:
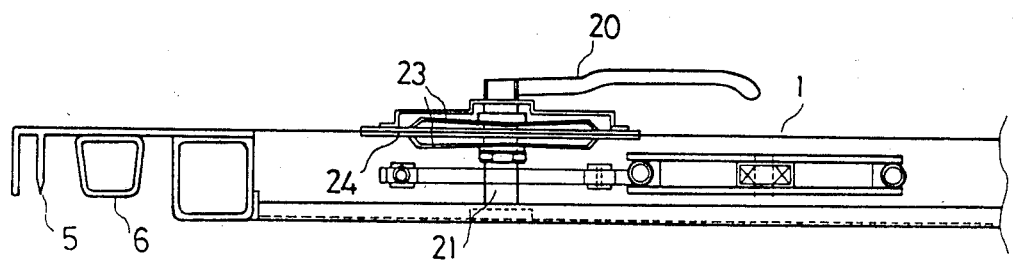
FIG. 4 is a section view taken along line IV—IV of FIG. 2.
Figure 5:
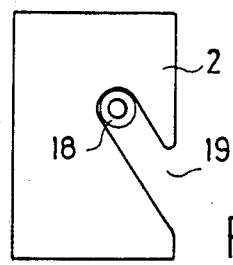
FIG. 5 is a detailed view illustrating the diagonal or oblique slot forming member and associated shaft member constituting components of the locking means of the invention in the closed position of the door.

Referring to FIG. 4, the transition of an interference field into the protected space through the region of the shaft 21 of handle 20 which passes through the front wall of the door is prevented by means of a contact disc 23 formed of a highly electrically conductive material. The disc 23 is attached to the shaft 21 so that the face of the disc 23 rubs against a disc 24 situated beneath the same and attached to the front wall of the door as the handle 20 is turned.

In operation, when the door is to be moved from an opened to a closed position, the shafts 17 and the lever system are initially in the position illustrated in FIG. 2. The closing of the door 1 is begun by moving the door through a normal pivoting movement around the pivot shaft 8 of the hinge device 7 until the door 1 reaches the position shown in FIG. 1. In this position, the guide 6 and the contact knife 5 are in opposed relationship to the contact springs 4 and the pivoting movement of the door around the shaft 8 is terminated. When in this position, the rollers 18 journaled on the ends of the shaft 17 are positioned at the initial ends or mouths of the respective diagonal slots 19 located at both sides of the stationary frame structure 2. To facilitate such positioning, the angle of the door 1 with respect to the stationary structure 2 can be adjusted by means of the screws 12. The forces required in order to continue the closing movement of the door through the movement thereof in a substantially linear movement path is generated by then rotating the handle 20 downwardly so that the shafts 17 and the respective pairs of rollers 18 journaled thereon move away from each other. The rollers 18 are captured and guided within the diagonal slots 19 of the stationary structure 2 towards the position shown in FIG. 5 which illustrates a roller 18 of the upper shaft 17 when the door 1 has reached its closed position. As the shafts 17 are thus moved in opposite directions away from each other, the shafts 8 and 9 of the hinge devices 7 rotate in opposite directions so as to eliminate any lateral movement of the door 1. The rolls 18 and the shafts 17, which are positioned symmetrically, thus act to pull the door 1, guided by the guides 6, into contact with the seal structure in the frame 2 in a linear direction substantially perpendicular to the plane of the door.

When the door has reached its final closed position, the contact knife 5 and guide 6 are positioned between the spring contacts 4 to prevent the transition of interference fields through the contact zone of the door and stationary frame structure. By virtue of the linear movement of the door during its final closing movement, the contact springs are not pried apart to the degree associated with conventional pivoting door structures so that the seal construction does not tend to become damaged. Moreover, the compression forces required for the final linear movement of the door are substantially less than that required in conventional pivoting door constructions.

Obviously, numerous modifications and variations of the present invention are possible in the light of the above teachings. For example, the design of the labyrinth structure and the number of springs and contact knives may vary and the locking means for the door and stationary frame structure may also differ from that described above. It is therefore to be understood that within the scope of the claims appended hereto, the invention may be practiced otherwise than as specifically disclosed herein.

What is claimed is:

1. In a door assembly in a construction for substantially preventing the transition of interference fields, in particular of high-frequency electromagnetic fields, into a space, the door assembly including a door pivotally mounted to a stationary structure by hinge means, and wherein said door and stationary structure are provided with co-operating means for producing an interference field transition-preventing contact when said door is in a closed position with respect to said stationary structure, the improvement comprising:
   said hinge means providing a pivoting movement of said door to a position wherein said door is substantially linearly displaced with respect to said stationary structure; and
   means provided on said door and stationary structure for moving said door in a substantially linear movement path to said closed position with respect to said stationary structure, whereby said contact means produces an interference field transition-preventing contact, and said means also preventing lateral movement of said door during the substantailly linear closing movement thereof;
   wherein said means for moving said door in a substantially linear movement path to said closed position to produce the interference field transition-preventing contact include locking means for locking said door in its closed position to said stationary structure, said locking means including guide means provided on said door and stationary structure for guiding said door in the substantially linear movement path, and further including
   means for operating said locking means, said operating means including lever members operatively associated with said locking means and a handle coupled to said door and operatively associated with said lever members;
   wherein said hinge means include a first pivot shaft mounted on said stationary structure defining a pivot axis with respect to which said door moves in said pivoting movement, and a second shaft mounted or said door and extending substantially parallel to said first shaft, said first and second shafts being interconnected by means for permitting said door to move in said linear movement path; further including
   means provided on said hinge means for limiting the extent of pivoting movement of said door;
   wherein said pivoting movement limiting means include a spring-loaded stop member mounted on said hinge means;
   wherein said stop member is mounted on said hinge means for adjustable positioning;
   wherein said means for producing the interference field transition-preventing contact is a labyrinth seal; and
   said means for preventing lateral movement of said door also constitute means for preventing damage to the labyrinth seal.

2. The combination of claim 1 wherein said door has a substantially planar face and wherein said locking means comprise a first set of members mounted on said door for movement in a plane substantially parallel to the plane of said door face, and a second set of members provided on said stationary structure for operative association with said first set of members during the movement of said door in said linear movement path, and wherein said first and second set of members are jointly operative to produce a force substantially perpendicular to said door face.

3. The combination of claim 2 wherein said first set of members include at least two members mounted on said door for movement in mutually opposite directions.

4. The combination of claim 5 wherein said first set of members include at least two shaft members mounted on said door for movement in mutually opposite directions in a plane substantially parallel to the plane of said door face, and wherein said guide means define slots extending obliquely in said second set of members in a plane substantially perpendicular to the plane of said door face, and regions of said shafts of said first set of members being receiveable in said slots of said guide means.

5. The combination of claim 4 wherein rollers are rotatably journaled on said shafts at said end regions thereof, said rollers being receivable in said slots.

6. The combination of claim 1, wherein
said first and second pivot shafts are mounted to rotate in opposite directions, to constitute part of said means for preventing lateral movement of said door during the substantially linear closing movement.

7. The combination of claim 1, wherein
said stop member comprises
a projection connected to said means interconnecting said first and second pivot shafts,
a screw threaded through said projection, and
a spring disposed to urge said door against an end of said screw.

8. The combination of claim 7, wherein
said screw is disposed to be rotatable to adjust position of said door.

9. The combination of claim 4, wherein
said at least two shafts members are mounted on said door for movement in a direction substantially perpendicular to axes thereof.

10. The combination of claim 1, wherein
said means for permitting said door to move constitutes means for moving said door in a substantially linear direction of about 2 cm.

11. The combination of claim 7, wherein
said pivoting movement limiting means engages said first and second pivot shafts such that a plane formed by the axes of said pivot shafts is not parallel to a plane of said door.

* * * * *